(12) United States Patent
Okuda et al.

(10) Patent No.: US 11,171,279 B2
(45) Date of Patent: Nov. 9, 2021

(54) THERMOELECTRIC CONVERSION ELEMENT MODULE

(71) Applicant: Murata Manufacturing Co., Ltd., Kyoto (JP)

(72) Inventors: Noriaki Okuda, Kyoto (JP); Takanori Nakamura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/589,233

(22) Filed: Oct. 1, 2019

(65) Prior Publication Data

US 2020/0044134 A1 Feb. 6, 2020

Related U.S. Application Data

(63) Continuation of application No. PCT/JP2018/014140, filed on Apr. 2, 2018.

(30) Foreign Application Priority Data

Apr. 10, 2017 (JP) .............................. JP2017-077504

(51) Int. Cl.
*H01L 35/32* (2006.01)
*G08C 17/02* (2006.01)
*H02J 7/00* (2006.01)

(52) U.S. Cl.
CPC .............. *H01L 35/32* (2013.01); *G08C 17/02* (2013.01); *H02J 7/00* (2013.01); *G08C 2200/00* (2013.01)

(58) Field of Classification Search
CPC ................................ H01L 35/32; G08C 17/02
See application file for complete search history.

(56) References Cited

U.S. PATENT DOCUMENTS

| 5,049,981 A | 9/1991 | Dahringer |
| 2016/0097684 A1 | 4/2016 | Funahashi |

FOREIGN PATENT DOCUMENTS

| CN | 102865309 A | 1/2013 |
| JP | H04-298068 A | 10/1992 |
| JP | H11-103002 A | 4/1999 |
| JP | 2009-053175 A | 3/2009 |
| JP | 2013-057659 A | 3/2013 |
| JP | 2015-010994 A | 1/2015 |
| JP | 2015-032747 A | 2/2015 |
| JP | 2016-196087 A | 11/2016 |
| KR | 10-2016-0049514 A | 5/2016 |
| WO | 2014/050349 A1 | 4/2014 |

OTHER PUBLICATIONS

Pascal, et al., JP-2013057659-A, English Machine Translation, pp. 1-19. (Year: 2013).*
International Search Report for PCT/JP2018/014140 dated Jun. 26, 2018.
Written Opinion for PCT/JP2018/014140 dated Jun. 26, 2018.
Chinese Office action for 201880019385.2 dated Jan. 6, 2021.

* cited by examiner

*Primary Examiner* — Tae-Sik Kang
(74) *Attorney, Agent, or Firm* — Pearne & Gordon LLP

(57) ABSTRACT

A thermoelectric conversion element module (101) includes: a heat receiving part (3) disposed so as to be contactable with a heat source; a thermoelectric conversion element (10) having a first surface (10a) and a second surface (10b), the first surface (10a) being disposed in contact with the heat receiving part (3); and a heat radiating part (5) that is disposed in contact with the second surface (10b) and has an inner space (21).

7 Claims, 7 Drawing Sheets

THERMOELECTRIC CONVERSION ELEMENT MODULE

This is a continuation of International Application No. PCT/JP2018/014140 filed on Apr. 2, 2018 which claims priority from Japanese Patent Application No. 2017-077504 filed on Apr. 10, 2017. The contents of these applications are incorporated herein by reference in their entireties.

BACKGROUND OF THE DISCLOSURE

Field of the Disclosure

The present disclosure relates to a thermoelectric conversion element module.

Description of the Related Art

Japanese Unexamined Patent Application Publication No. 2015-10994 (Patent Document 1) describes an example of a temperature detecting device. This device includes, in this sequence from the distal end, a detecting part, a first heat transfer part, a power generating part, a second heat transfer part, a releasing part, and an output part.

Patent Document 1: Japanese Unexamined Patent Application Publication No. 2015-10994

BRIEF SUMMARY OF THE DISCLOSURE

The temperature detecting device described in Patent Document 1 has an elongated shape overall because the detecting part and the power generating part are separated by the first heat transfer part, and the power generating part and the releasing part are separated by the second heat transfer part. In this device, because the output part is located at a position farther from the heat source than the releasing part is, it is difficult to reduce the size.

Under the circumstances, the purpose of the present disclosure is to provide a thermoelectric conversion element module having a compact structure.

To achieve the above-described purpose, a thermoelectric conversion element module of the present disclosure includes: a heat receiving part disposed so as to be contactable with a heat source; a thermoelectric conversion element having a first surface and a second surface, the first surface being disposed in contact with the heat receiving part; and a heat radiating part that is disposed in contact with the second surface and has an inner space.

According to the present disclosure, it is possible to reduce the size of the thermoelectric conversion element module.

DETAILED DESCRIPTION OF THE DISCLOSURE

Figure 1:
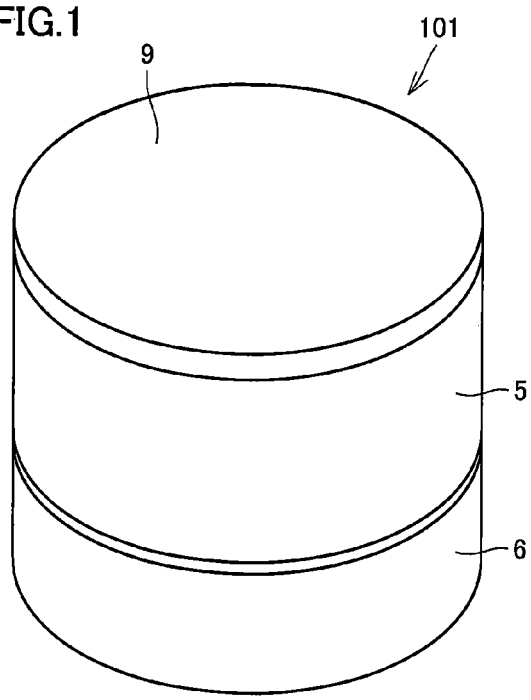
FIG. 1 is a first perspective view of a thermoelectric conversion module according to Embodiment 1 of the present disclosure.

The dimension ratios shown in the drawings do not necessarily faithfully reflect the actual ratios, and the dimension ratios may be exaggerated for ease of explanation. When the ideas about the top and bottom are mentioned in the description below, they do not necessarily mean the absolute top and bottom, and they may mean the relative top and bottom within the illustrated orientation.

Embodiment 1

Figure 2:
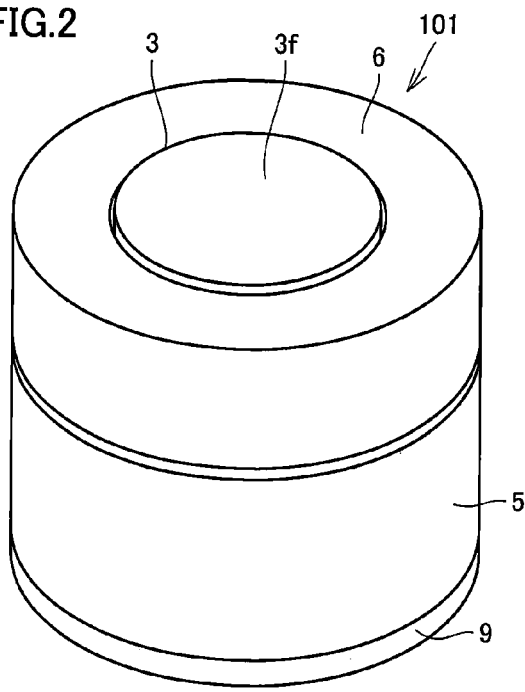
FIG. 2 is a second perspective view of the thermoelectric conversion module according to Embodiment 1 of the present disclosure.
Figure 3:
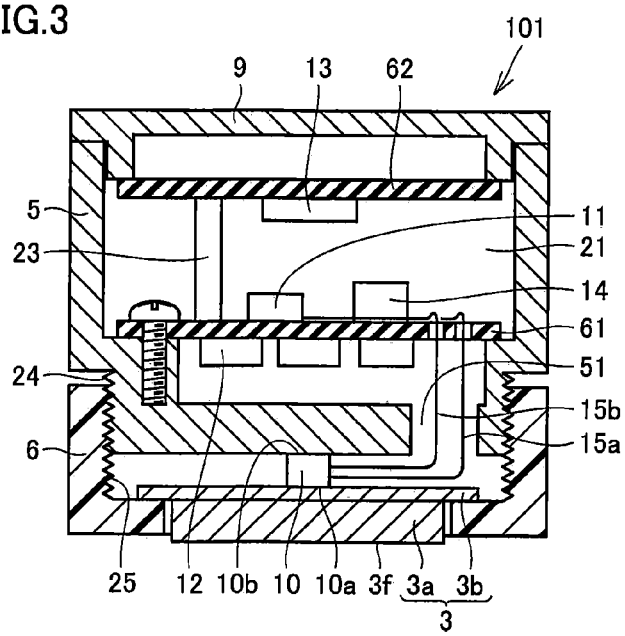
FIG. 3 is a sectional view of the thermoelectric conversion module according to Embodiment 1 of the present disclosure.

Referring to FIGS. 1 to 6, a thermoelectric conversion element module according to Embodiment 1 of the present disclosure will be described. FIG. 1 is a perspective view of a thermoelectric conversion element module 101 according to this embodiment. FIG. 2 is a perspective view of the thermoelectric conversion element module 101 in an upside-down state. FIG. 3 is a sectional view of the thermoelectric conversion element module 101. The thermoelectric conversion element module 101 includes: a heat receiving part 3 having a portion exposed outside so as to be contactable with a heat source; a thermoelectric conversion element 10 having a first surface 10a and a second surface 10b, the first surface 10a being disposed in contact with the heat receiving part 3; a heat radiating part 5 disposed in contact with the second surface 10b and has an inner space 21; and a power supply circuit 11 disposed in the inner space 21.

The heat radiating part 5 is made of a material having a high thermal conductivity. The heat radiating part 5 is made of, for example, metal. The heat radiating part 5 may be made of, for example, an aluminum alloy. The heat radiating part 5 has a cylindrical outer circumferential surface and a bottom surface. The bottom surface of the heat radiating part 5 has a through-hole 51. Wires 15a and 15b pass through the through-hole 51. In FIG. 3, the heat radiating part 5 has an open-top structure, and a lid 9 is provided so as to cover the open portion at the top. As described herein, the heat radiating part 5 may have a container shape. Herein, although the heat radiating part 5 has a shape having a bottom surface, the presence of the bottom surface is not essential. The open portion in the heat radiating part 5 that is covered by the lid does not need to be located at the top, and it may be provided at another side. The presence of the lid is not essential. The heat radiating part 5 only needs to have a structure that can define a certain inner space.

The lid 9 is made of, for example, metal. The lid 9 may be made of the same material as the heat radiating part 5. The lid 9 may be made of, for example, an aluminum alloy. A sealing member, such as an O ring, may be disposed between the lid 9 and the heat radiating part 5. A fixing part 6 is attached below the heat radiating part 5 in FIG. 3. The fixing part 6 is made of a material having a low thermal conductivity. The fixing part 6 may be made of, for example, resin. The fixing part 6 may be made of, for example, polycarbonate resin.

The inner space 21 accommodates substrates 61 and 62. A power storage part 12 is mounted to the lower surface of the substrate 61. A power supply circuit 11 and a sensor 14 are mounted to the upper surface of the substrate 61. A substrate connector 23, which includes, for example, a pin and a socket, provides the electrical connection between different substrates. A wireless communication part 13 is mounted to the lower surface of the substrate 62. The wireless communication part 13 may perform, for example, BLE (Bluetooth Low Energy) communication. The use of two substrates 61 and 62 is merely an example, and the number, size, position, and orientation of the substrates disposed in the inner space 21 are not limited to those described herein. The surfaces and the positions in the surfaces of the plurality of substrates on which the components, including the power supply circuit 11, the power storage part 12, the wireless communication part 13, and the sensor 14, are mounted as described herein are merely examples and are not limited to those described herein.

Figure 4:
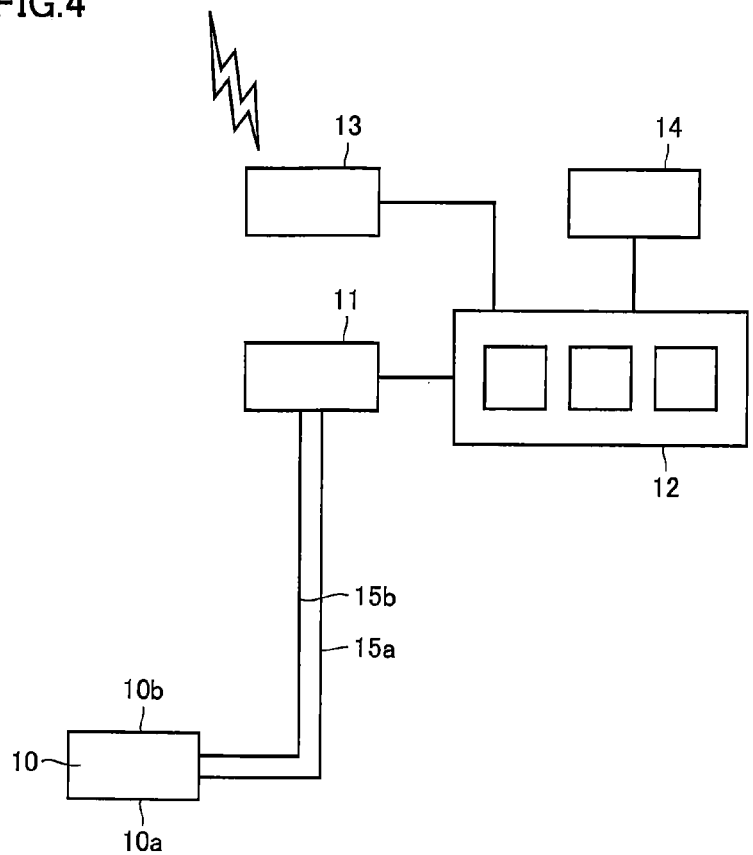
FIG. 4 is a conceptual diagram of the thermoelectric conversion module according to Embodiment 1 of the present disclosure.

FIG. 4 is a conceptual diagram of the components of the thermoelectric conversion element module 101. The thermoelectric conversion element 10 is connected to the power supply circuit 11 by the wires 15a and 15b. The power supply circuit 11 is electrically connected to the power storage part 12. The power storage part 12 is electrically connected to the wireless communication part 13. The sensor 14 is electrically connected to the wireless communication part 13. The power supply circuit 11 is used to increase the voltage of the electricity generated by the thermoelectric conversion element 10. The electricity that has been increased in voltage by the power supply circuit 11 is stored in the power storage part 12.

Figure 5:
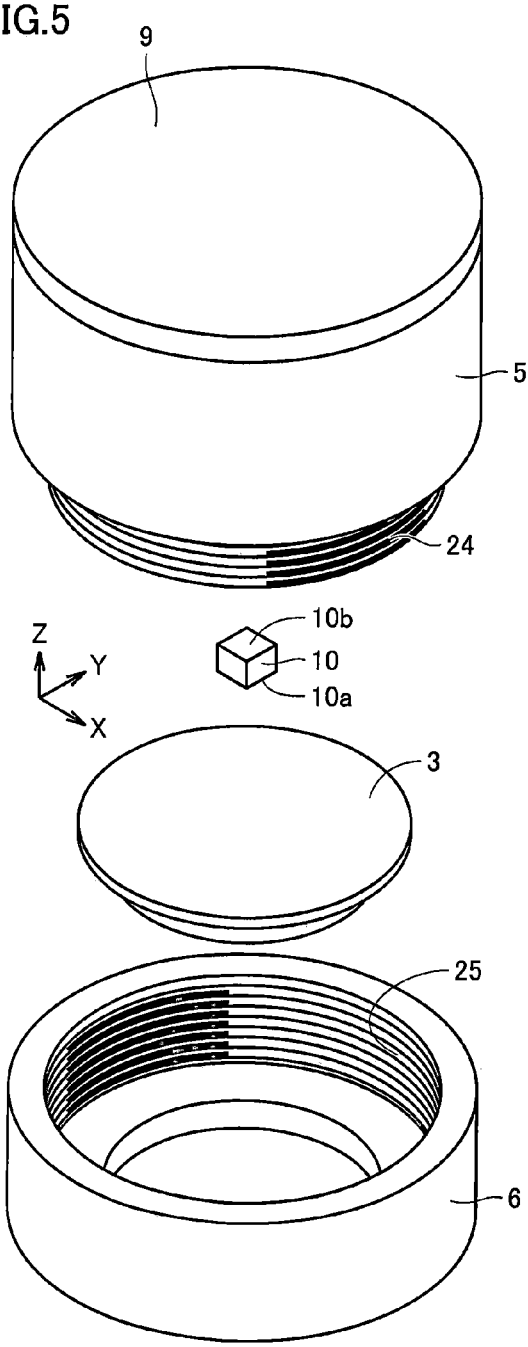
FIG. 5 is an exploded view of the thermoelectric conversion module according to Embodiment 1 of the present disclosure.

FIG. 5 is an exploded view of the thermoelectric conversion element module 101. In FIG. 5, the illustration of the wires 15a and 15b extending from the thermoelectric conversion element 10 is omitted. As shown in FIG. 5, the fixing part 6 has a cylindrical shape and has a screw thread 25, which is a female screw, in the inner circumferential surface. The heat radiating part 5 has a cylindrical portion at the lower part thereof, and a screw thread 24, which is a male screw, is formed on the outer circumferential surface of the cylindrical portion. The fixing part 6 and the heat radiating part 5 are fastened together via the screw threads 24 and 25. As a result of the fixing part 6 and the heat radiating part 5 being fastened together, as shown in FIG. 3, the thermoelectric conversion element 10 is sandwiched and fixed between the heat receiving part 3 and the heat radiating part 5.

Figure 6:
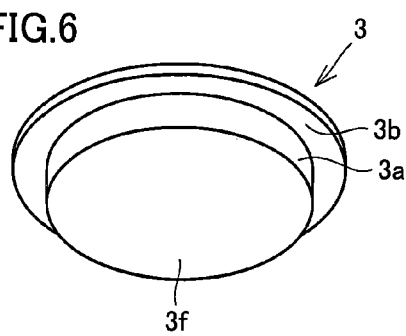
FIG. 6 is a perspective view of a heat receiving part of the thermoelectric conversion module according to Embodiment 1 of the present disclosure.

FIG. 6 shows the heat receiving part 3 alone. The heat receiving part 3 is an integrally formed component that is made of a single material. The heat receiving part 3 includes a central portion 3a and a flange portion 3b projecting around the central portion 3a. The central portion 3a of the heat receiving part 3 has a surface 3f. The surface 3f is a surface to be brought into contact with a heat source. In the example shown herein, the surface 3f is a flat surface. As shown in FIG. 3, the surface 3f of the heat receiving part 3 is projecting beyond the lower surface of the fixing part 6.

According to this embodiment, it is possible to reduce the size of the thermoelectric conversion element module. In particular, in the example shown in this embodiment, the heat receiving part 3, which includes a portion exposed outside so as to be contactable with a heat source, is in direct contact with one surface of the thermoelectric conversion element 10, the heat radiating part 5, which is in contact with the other surface of the thermoelectric conversion element 10, has the inner space 21, and the inner space 21 accommodates the power supply circuit 11. Hence, it is possible to reduce the size of the overall thermoelectric conversion element module.

As has been described in this embodiment, it is desirable that the thermoelectric conversion element module have, between the heat receiving part 3 and the heat radiating part 5, the fixing part 6 that holds the thermoelectric conversion element 10. More specifically, it is desirable that the thermoelectric conversion element module have the fixing part 6 that fixes the heat receiving part 3 relative to the heat radiating part 5 in a state in which the heat receiving part 3 and the heat radiating part 5 sandwich the thermoelectric conversion element 10. By adopting this configuration, it is possible to securely fix the heat receiving part 3 and the heat radiating part 5 relative to each other, and at the same time, it is possible to fix the thermoelectric conversion element in a preferred state. As a result, it is possible to produce a thermoelectric conversion element module from a small number of components.

As has been described in this embodiment, it is desirable that the heat radiating part 5 have the screw thread 24, the fixing part 6 have the screw thread 25 configured to be screwed with the screw thread 24 of the heat radiating part 5, and the fixing part 6 and the heat radiating part 5 be joined together as a result of one of them being screwed into the other. By adopting this configuration, it is possible to easily connect the fixing part 6 and the heat radiating part 5. Furthermore, the size of the gap between the heat receiving part 3 and the heat radiating part 5 can be adjusted according to the extent to which the screw threads 24 and 25 are screwed together. Hence, even in the case where there is a possibility that thermoelectric conversion elements 10 having multiple different Z-direction dimensions are used, it is possible to realize a state in which the heat receiving part 3 and the heat radiating part 5 appropriately sandwich the thermoelectric conversion element 10 of any size therebetween. Note that, although an example in which the screw thread 24 of the heat radiating part 5 is a male screw and the screw thread 25 of the fixing part 6 is a female screw has been shown in this embodiment, the relationship between the male screw and the female screw may be reversed.

As has been described in this embodiment, it is desirable that the heat receiving part 3 be a single member, the heat receiving part 3 have the flange portion 3b projecting so as to surround the outer circumference, the fixing part 6 be in contact with the flange portion 3b, and the heat receiving part 3 project beyond the fixing part 6. By forming the heat receiving part 3 from a single member, the number of components can be reduced. Since the flange portion 3b is provided on the heat receiving part 3, it is easy to fix the heat receiving part 3. By employing a structure in which the heat receiving part 3 projects beyond the fixing part 6, it is easy to realize a state in which the heat receiving part 3 is in contact with, and the fixing part 6 is not in contact with, a target object, serving as the heat source.

As has been described in this embodiment, the power storage part 12, which is configured to store the electricity produced by the thermoelectric conversion element 10, is provided, and the power storage part 12 is disposed in the inner space 21. Because adopting this configuration makes it possible to store, for future use, the electricity generated by utilizing a temperature difference, the thermoelectric conversion element module does not require battery replacement. The power storage part 12 may be an MLCC (Multi-Layered Ceramic Capacitor), an all-solid-state battery, or the like. By using the MLCC or the all-solid-state battery as the power storage part 12, the thermoelectric conversion element module can be used for a long time under a high-temperature or a low-temperature environment. Although FIGS. 3 and 4 show the power storage part 12 including three elements, this is merely an example. The number of the elements included in the power storage part 12 is not limited to three and may be any number.

As has been described in this embodiment, it is desirable that the wireless communication part 13 for performing, using the electricity stored in the power storage part 12, at least one of sending and receiving be provided, and the wireless communication part 13 be provided in the inner space 21. By adopting this configuration, it is possible to receive or send certain information from and to the outside by the wireless communication part 13.

As has been described in this embodiment, the sensor 14 that performs measurement using the electricity stored in the power storage part 12 is provided. By adopting this configuration, it is possible to perform a desired type of measurement. In particular, because the electricity for operating the sensor 14 is supplied from the power storage part 12, and the electricity generated by the temperature difference is stored in the power storage part 12, it is possible to continue a measuring task without the need of battery replacement. In the example shown herein, the sensor 14 is disposed in the inner space 21. The size, shape, and position of the sensor 14 are schematically shown herein and are merely an example. The position where the sensor is disposed is not limited to the inside of the inner space 21. For example, the sensor may be disposed inside the space defined by the heat receiving part 3 and the fixing part 6. Alternatively, the sensor may be disposed outside the thermoelectric conversion element module.

Figure 7:
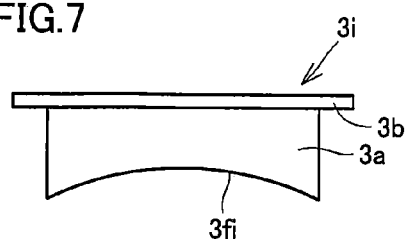
FIG. 7 is a side view of a modification of the heat receiving part of the thermoelectric conversion module according to Embodiment 1 of the present disclosure.

In this embodiment, although it has been described that the heat receiving part 3 of the thermoelectric conversion element module 101 has a flat lower surface, the shape of the lower surface of the heat receiving part may be appropriately selected. For example, a heat receiving part 3i, which is shown in FIG. 7, is also acceptable. The heat receiving part 3i has a surface 3fi. The surface 3fi has a curved shape corresponding to a portion of a cylindrical outer circumferential surface. By using the heat receiving part 3i like this, the heat receiving part 3i can be more easily brought into contact with the outer circumferential surface of a cylindrical target object, such as a pipe. In particular, by making the radius of curvature of the surface 3fi equal to the radius of curvature of the target object, the heat receiving part 3i is in contact with the target object over a large area and thus can efficiently receive heat.

Embodiment 2

Figure 8:
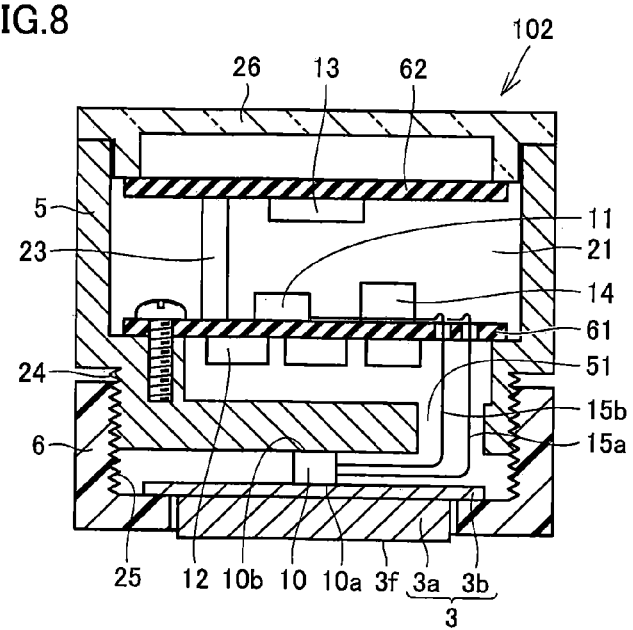
FIG. 8 is a sectional view of a thermoelectric conversion element module according to Embodiment 2 of the present disclosure.

Referring to FIG. 8, a thermoelectric conversion element module according to Embodiment 2 of the present disclosure will be described. FIG. 8 is a sectional view of a thermoelectric conversion element module 102. The configuration of the thermoelectric conversion element module 102 is basically the same as that of the thermoelectric conversion element module 101 described in Embodiment 1, except for the following points.

In the thermoelectric conversion element module 102, a lid 26 is provided so as to cover the opening above the heat radiating part 5. The lid 26 is made of an insulating body. The lid 26 is made of, for example, resin. The lid 26 may be made of a transparent or a semitransparent resin. An LED (Light Emitting Diode) for indicating the operating state may be disposed in the inner space 21. By forming the lid 26 from a transparent or a semitransparent material, the light-emitting state of the LED can be viewed from the outside.

Also, in this embodiment, it is possible to obtain the same advantages as those described in Embodiment 1. In this embodiment, the lid 26 is made of an insulating body. Specifically, because the inner space 21 is not completely surrounded by a conducting body, the radio wave transmitted/received by the wireless communication part 13 is not blocked. Accordingly, the communication by the wireless communication part 13 is easily performed.

Embodiment 3

Figure 9:
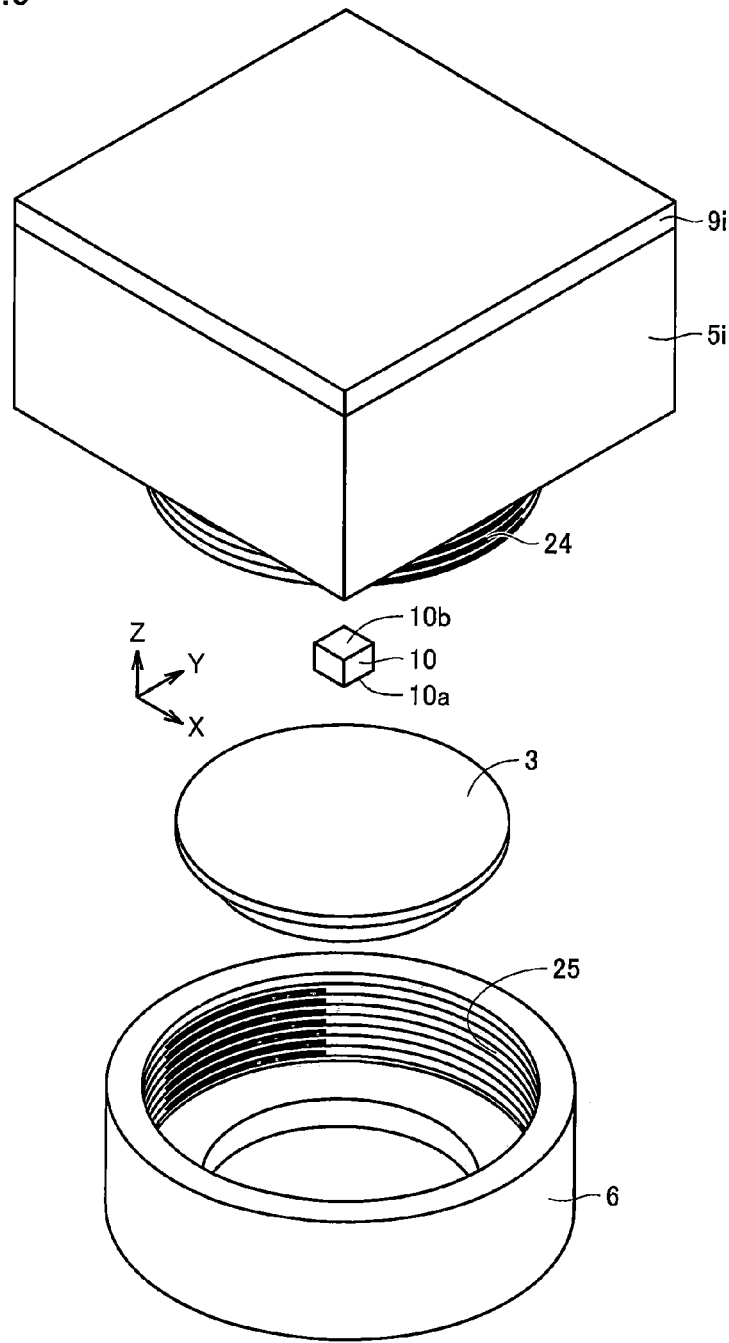
FIG. 9 is an exploded view of a thermoelectric conversion element module according to Embodiment 3 of the present disclosure.

Referring to FIG. 9, a thermoelectric conversion element module according to Embodiment 3 of the present disclosure will be described. FIG. 9 is an exploded view of a thermoelectric conversion element module according to this embodiment. The configuration of the thermoelectric conversion element module is basically the same as that of the thermoelectric conversion element module 101 described in Embodiment 1, except for the following points.

The thermoelectric conversion element module according to this embodiment includes a heat radiating part 5i and a lid 9i instead of the heat radiating part 5 and the lid 9 in Embodiment 1. The heat radiating part 5i and the lid 9i do not have cylindrical shapes but have rectangular parallelepiped shapes.

Also, in this embodiment, it is possible to obtain the same advantages as those described in Embodiment 1. The rectangular parallelepiped heat radiating part 5i is sometimes more desirable than the cylindrical heat radiating part 5i, depending on the shapes of the components to be accommodated in the inner space. By configuring as in this embodiment, it may be possible to increase the volume of the inner space.

Although an example in which the heat radiating part has a rectangular parallelepiped shape has been shown here, the shape of the heat radiating part is not limited thereto and may be another shape.

Embodiment 4

Figure 10:
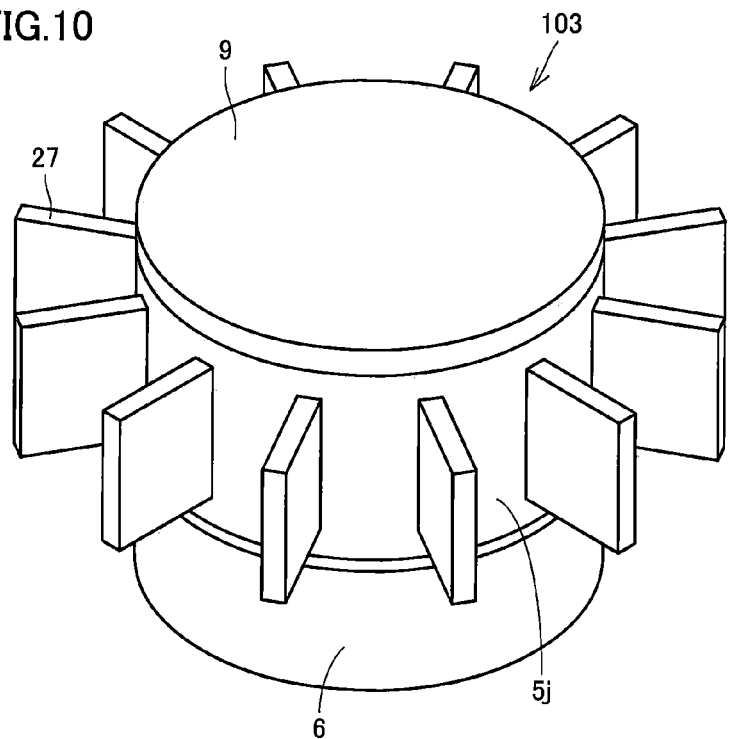
FIG. 10 is a perspective view of a thermoelectric conversion element module according to Embodiment 4 of the present disclosure.
Figure 11:
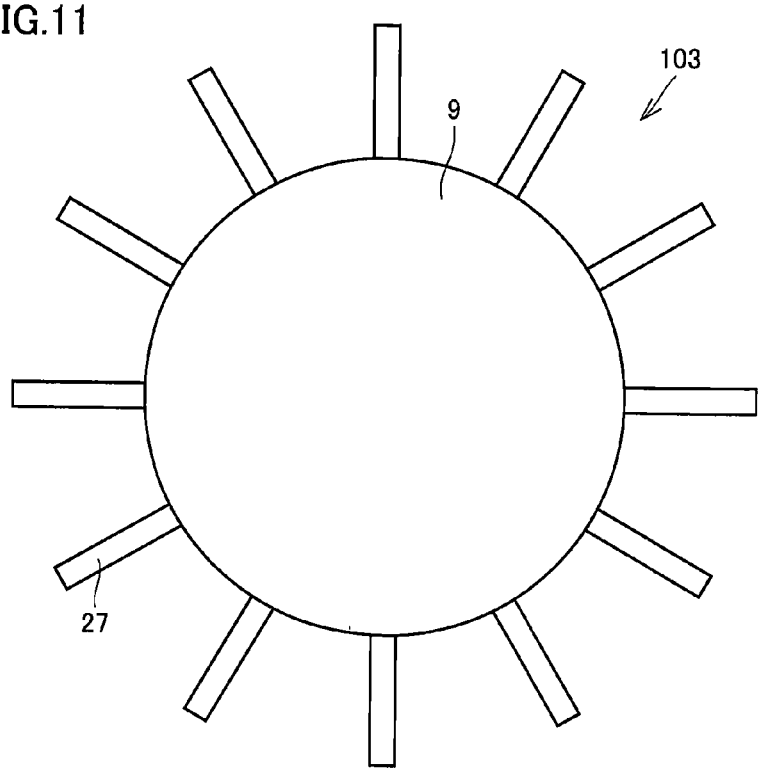
FIG. 11 is a plan view of the thermoelectric conversion element module according to Embodiment 4 of the present disclosure.

Referring to FIGS. 10 and 11, a thermoelectric conversion element module according to Embodiment 4 of the present disclosure will be described. FIG. 10 is a perspective view of a thermoelectric conversion element module 103 according to this embodiment. FIG. 11 is a plan view of the thermoelectric conversion element module 103. The configuration of the thermoelectric conversion element module is basically the same as that of the thermoelectric conversion element module 101 described in Embodiment 1, except for the following points.

The thermoelectric conversion element module according to this embodiment includes a heat radiating part 5j. The heat radiating part 5j has a cylindrical body, and a plurality of radially extending fins 27 are provided on the outer circumference of the body. The shape, size, number, and positional relationship of the fins 27 shown herein are merely an example. For example, the number of the fins 27 may be only one or two. Although the plurality of fins 72 are flat herein, the fins 72 do not need to be flat.

Also, in this embodiment, it is possible to obtain the same advantages as those described in Embodiment 1. In this embodiment, because the heat radiating part 5j has at least one fin 27, heat release is promoted by the function of the fin 27. Accordingly, it is possible to obtain a reliable thermoelectric conversion element module. The fins may be connected to another component.

Embodiment 5

Figure 12:
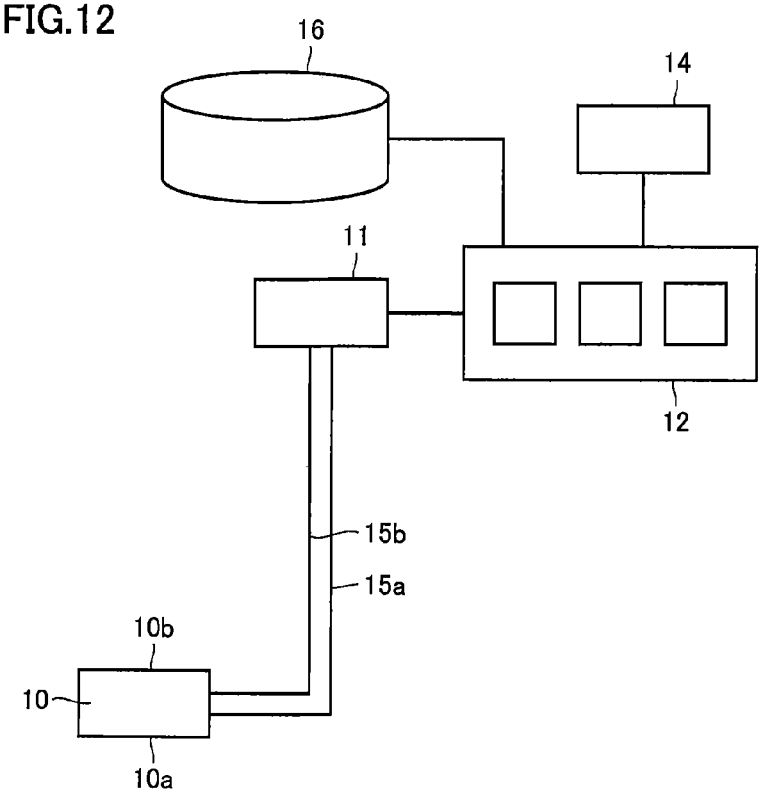
FIG. 12 is a conceptual diagram of the thermoelectric conversion element module according to Embodiment 5 of the present disclosure.

Referring to FIG. 12, a thermoelectric conversion element module according to Embodiment 5 of the present disclosure will be described. As shown in FIG. 12, the thermoelectric conversion element module according to this embodiment includes a data recording part 16 instead of the wireless communication part 13. The data recording part 16 is connected to the power storage part 12. The data of the measurement result obtained by the sensor 14 is recorded in the data recording part 16. The data recording part 16 is disposed in the inner space 21 of the heat radiating part 5.

Also, in this embodiment, it is possible to obtain the same advantages as those described in Embodiment 1. The data recording part 16 can operate by receiving the supply of power from the power storage part 12.

Embodiment 6

Figure 13:
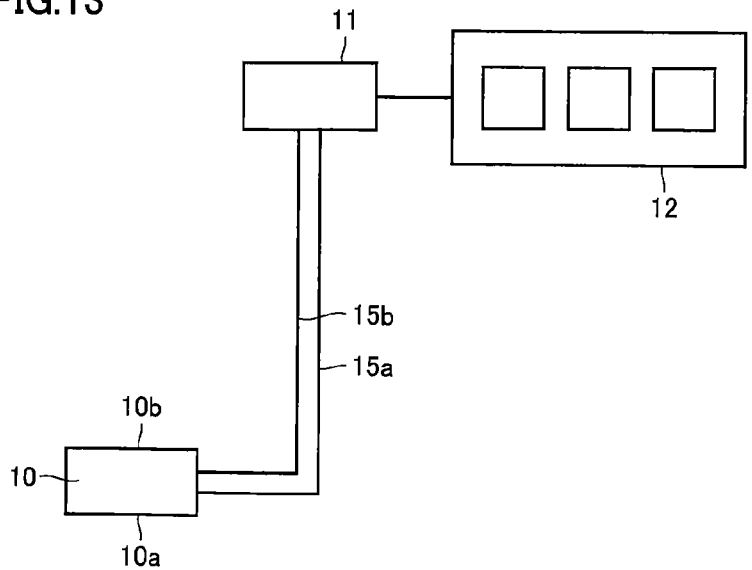
FIG. 13 is a conceptual diagram of a thermoelectric conversion element module according to Embodiment 6 of the present disclosure.

Referring to FIG. 13, a thermoelectric conversion element module according to Embodiment 6 of the present disclosure will be described. The thermoelectric conversion element module according to this embodiment has a simpler configuration than the other embodiments. The thermoelectric conversion element module according to this embodiment does not have the wireless communication part 13, the sensor 14, or the data recording part 16, but the power storage part 12. The power storage part 12 is connected to the power supply circuit 11.

Also, in this embodiment, it is possible to obtain the same advantages as those described in Embodiment 1. In this embodiment, the number of components can be reduced. In this thermoelectric conversion element module, the electricity generated in the thermoelectric conversion element 10 can be stored in the power storage part 12. The electricity thus stored in the power storage part 12 may be extracted from the thermoelectric conversion element module by certain means. For example, it is possible to configure such that the thermoelectric conversion element module is attached to the heat source while the electricity generated in the thermoelectric conversion element 10 is being stored in the power storage part 12, and the electricity is extracted from the power storage part 12 in the thermoelectric conversion element module after the thermoelectric conversion element module is removed from the heat source and is collected.

Note that, in the configurations having the wireless communication part 13 in the embodiments described above, the information may be retrieved by wire instead of wireless. Specifically, a certain wire extending from the thermoelectric conversion element module may be provided to enable the information retrieval through the wire. A certain connector may be provided on the thermoelectric conversion element module, and the information may be retrieved by using an attachable/detachable cable.

The above-described embodiments may be appropriately combined.

The above-described embodiments disclosed herein are not limiting in all respects. The scope of the present disclosure is defined by the claims and includes all modifications having meanings equivalent to the claims and within the scope of the claims.

3 heat receiving part
3a central portion
3b flange portion
3f, 3fi surface
5, 5i, 5j heat radiating part
6 fixing part
9 (metal) lid
10 thermoelectric conversion element
10a first surface
10b second surface
11 power supply circuit
12 power storage part
13 wireless communication part
14 sensor
15a, 15b wire
16 data recording part
21 inner space
23 substrate connector
24, 25 screw thread
26 (resin) lid
27 fin
51 through-hole
61, 62 substrate
101, 102, 103 thermoelectric conversion element module

The invention claimed is:

1. A thermoelectric conversion element module comprising:
   a heat receiving part disposed so as to be contactable with a heat source;
   a thermoelectric conversion element having a first surface and a second surface, the first surface being disposed in contact with the heat receiving part;
   a heat radiating part disposed in contact with the second surface and having a first inner space; and
   a fixing part comprising a second inner space in which the thermoelectric conversion element and the heat receiving part are disposed,
   wherein the heat radiating part has a first screw thread,
   the fixing part has a second screw thread configured to be screwed with the first screw thread of the heat radiating part, and
   the fixing part with the second inner space having the thermoelectric conversion element and the heat receiving part, the heat receiving part, and the heat radiating part are joined together when one of the fixing part and the heat radiating part is screwed into another of the fixing part and the heat radiating part.

2. The thermoelectric conversion element module according to claim 1, wherein:
   the heat receiving part is a single member, the heat receiving part has a flange portion projecting so as to surround an outer circumference of a central portion of the heat receiving part, the fixing part is in contact with the flange portion, and the heat receiving part projects beyond the fixing part.

3. The thermoelectric conversion element module according to claim 1, further comprising:

a power supply circuit disposed in the first inner space; and a power storage part disposed in the first inner space and configured to store, via the power supply circuit, electricity generated by the thermoelectric conversion element.

4. The thermoelectric conversion element module according to claim 3, further comprising a wireless communication part disposed in the first inner space.

5. The thermoelectric conversion element module according to claim 3, further comprising a sensor configured to perform measurement using the electricity stored in the power storage part.

6. The thermoelectric conversion element module according to claim 2, further comprising:

a power supply circuit disposed in the first inner space; and a power storage part disposed in the first inner space and configured to store, via the power supply circuit, electricity generated by the thermoelectric conversion element.

7. The thermoelectric conversion element module according to claim 4, further comprising a sensor configured to perform measurement using the electricity stored in the power storage part.

* * * * *